United States Patent
Lee et al.

(10) Patent No.: US 6,768,158 B2
(45) Date of Patent: Jul. 27, 2004

(54) FLASH MEMORY ELEMENT AND MANUFACTURING METHOD THEREOF

(75) Inventors: Jong Ho Lee, Daejon (KR); Hyung Cheol Shin, Daejon (KR)

(73) Assignee: Korea Advanced Institute of Science and Technology, Daejon (KR)

( * ) Notice: Subject to any disclaimer, the term of this patent is extended or adjusted under 35 U.S.C. 154(b) by 0 days.

(21) Appl. No.: 10/234,501

(22) Filed: Sep. 4, 2002

(65) Prior Publication Data

US 2003/0042531 A1 Mar. 6, 2003

(30) Foreign Application Priority Data

Sep. 4, 2001 (KR) ......................................... 2001-54055

(51) Int. Cl.$^7$ ............................................. H01L 29/788
(52) U.S. Cl. ..................................... 257/315; 257/317
(58) Field of Search ................................ 257/315, 324, 257/328

(56) References Cited

U.S. PATENT DOCUMENTS 6,391,752 B1 * 5/2002 Colinge et al. ............. 438/585
6,580,124 B1 * 6/2003 Cleeves et al. ............. 257/331

* cited by examiner

*Primary Examiner*—David Nelms
*Assistant Examiner*—Tu-Tu Ho
(74) *Attorney, Agent, or Firm*—Harness, Dickey & Pierce, P.L.C.

(57) ABSTRACT

The present invention provides a flash memory element and its manufacturing method having improved overall memory characteristics by constituting a double-gate element for improving the scaling down characteristic of flash memory element. With the above double-gate flash memory structure, a flash memory element in the present invention improves the scaling down characteristic and the programming and retention characteristic of a flash memory element.

23 Claims, 11 Drawing Sheets

FLASH MEMORY ELEMENT AND MANUFACTURING METHOD THEREOF

BACKGROUND OF THE INVENTION

1. Field of the Invention

The present invention relates to a nano flash memory element and manufacturing method thereof. In more detail, it relates to a flash memory element having improved overall memory characteristics with a double-gate element being constituted therein for improving the scaling down characteristic of flash memory element.

2. Description of the Related Art

A flash memory is a well-known representative non-volatile memory and is quite useful for various application fields.

A flash memory is widely used for various electronic instruments as well as for memory itself.

In particular, it has been noticed that flash memory is suitable for the recently being developed embedded logic technology which requires a memory having no processing complexity.

A novel type of high-performance, highly-integrated flash memory can produce a large scale of added-value by being linked to a related logic as well as by memory itself, and thus various researches are currently being carried out worldwide on flash memory.

In addition, the capacity increase is urgently required for keeping in step with the functions of current electronic instruments being continuously developed.

Since an element for DRAM memory in the prior art has a comparatively good scaling down characteristic, it can be suited for given specification without any major problem.

On the other hand, as for an element for flash memory whose scaling down characteristic is not so good, a new manufacturing method and/or a new configuration of an element is required.

The main reason for this demand of new configuration is that there exists some limitation in scaling down the size of an element used for flash memory in the prior art.

FIG. 1a and FIG. 1b show an example of scaling down a flash memory element in the prior art.

Looking into FIG. 1b comparing with FIG. 1a, it is noticed that the gate height and the junction depth as well as the channel length are reduced, however, the thickness of the tunneling oxide film (14) and that of the inter-gates oxide film (18) between the floating electrode (16) and the control electrode (20) are not reduced.

Here, the numeral 10 represents a silicon substrate and the numeral 12 represents a source/drain area.

A conventional metal-oxide semiconductor (MOS) element can easily restrain a short-channel effect by using a thin gate oxide film according to the scaling down, however, a flash memory element can not afford the same performance.

An element constituting a flash memory has a similar configuration to a conventional complementary metal-oxide semiconductor (CMOS) element except having a floating electrode (16) for storing electric charges between a control electrode (20) and a channel of the element.

A tunneling oxide film (14) is constituted under the floating electrode (16), and the thickness of a tunneling oxide film (14) can not be reduced according to the scaling down.

The reason is that the thickness of a tunneling oxide film (14), through which the charges in a channel are tunneling to move into a floating electrode (16), can not be reduced less than 7 nm or 8 nm. If the thickness of a tunneling oxide film (14) is less than that, the charges stored in a floating electrode (16) are leaking back to the channel, and thus the retention characteristic of a memory becomes to be bad.

Researches on silicon-oxide-nitride-oxide-Semiconductor (SONOS) type flash memory element, which has a somewhat modified configuration compared with that of a conventional flash memory element, are currently being carried on. The configuration of SONOS type element is the same as that of FIG. 1 with the substance of the floating electrode (16) being substituted with a silicon nitride film ($Si_3N_4$).

In an SONOS type flash memory element, however, the thickness of oxide-nitride-oxide (ONO) film, which is corresponding to a gate oxide film in a CMOS element, is still thicker than that of the gate oxide film (for example, 2 nm/4 nm/4 nm), and thus the scaling down characteristic is worse than that of CMOS element having the same gate length.

Additionally, there exist traps, in which charges can be stored, in the nitride film corresponding to N in an ONO-structured film, and thus charges are trapped therein during a writing program.

Since the trap density is nonuniform, it requires gate length and width over a certain minimum value, and thus it has a limitation in improving its overall integrity.

SUMMARY OF THE INVENTION

The present invention is proposed to solve the problems of the prior art mentioned above. It is therefore the object of the present invention to provide a flash memory element and manufacturing method thereof, which introduces a new silicon oxide integrated (SOI) double-gate type flash memory element having highly-improved memory characteristics including an improved scaling down characteristic compared with the conventional flash memory element, and thereby fundamentally improves the performance and the integrity of a flash memory element at the same time.

To achieve the object mentioned above, the present invention presents a flash memory element comprising: a first oxide film formed on a surface of a silicon substrate; a fin active area vertically formed on the first oxide film with a narrow width; a gate tunneling oxide film formed on the top and at both sides of the fin active area; a floating electrode formed on the surfaces of the gate tunneling oxide film and the first oxide film for storing electric charges; a inter-gates oxide film formed on the surface of the floating electrode; and a control electrode formed on the surface of the inter-gates oxide film.

To achieve the object mentioned above, the present invention also presents a manufacturing method of a flash memory element comprising: the first process of forming a second oxide film on a silicon film of an SOI type wafer constituted of a silicon substrate, a first oxide film and a silicon film; the second process of forming a fin active area by forming a pattern thereon and etching it thereafter; the third process of forming a gate tunneling oxide film on the top and at both sides of the fin active area; the fourth process of forming a floating electrode on the surfaces of the gate tunneling oxide film and the first and the second oxide films for storing electric charges; the fifth process of forming a inter-gates oxide film on the surface of the floating electrode; and the sixth process of forming a control electrode on the surface of the inter-gates oxide film.

BRIEF DESCRIPTION OF THE DRAWINGS

FIG. 1a and FIG 1b are views illustrating the structure of a flash memory in the prior art, wherein FIG. 1a shows a sectional view of a flash memory before scaling down and FIG. 1b shows a sectional view after scaling down.

FIG. 2a and FIG. 2b are perspective views of a FinFET double-gate element in the prior art, wherein FIG. 2a is a perspective view with a gate being described to be transparent and FIG. 2b is a view with a gate being described to be opaque.

FIG. 3a~FIG. 3c are views illustrating the main portion of a double-gate element described in FIG. 2, wherein FIG. 3a is a top view of an element, and FIG. 3b and FIG. 3c are sectional views of an element in case of crossing the center of a channel in the lateral direction and the longitudinal direction respectively.

DESCRIPTION OF THE NUMERALS ON THE MAIN PARTS OF THE DRAWINGS

Figure 1A:
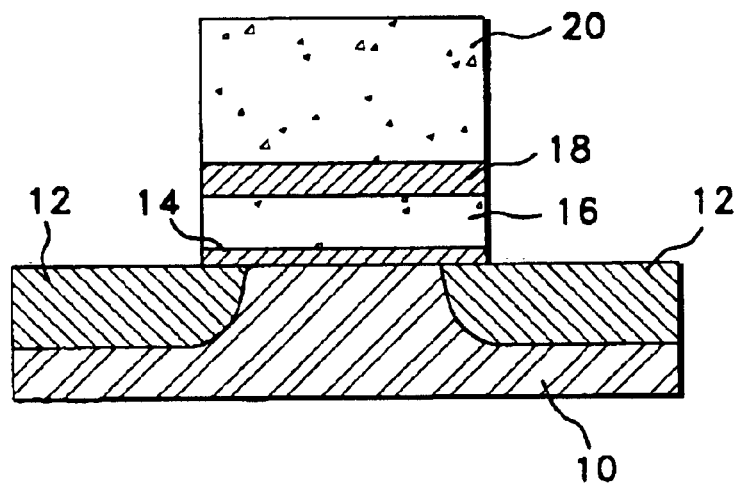

10: a silicon substrate
12: a source/drain area
14: a tunneling oxide film
16: a floating electrode (or a storage electrode)
18: a inter-gates oxide film
20: a control electrode
22: a first oxide film
24: a gate oxide film
26: a fin active area
28: a gate electrode
30: a second oxide film
32: a floating electrode (or a storage electrode)
34: a inter-gates oxide film
36: a control electrode
38: a spacer floating electrode
40: a nitride film
42: a gate tunneling oxide film
44: a third oxide film
46: a silicon film

DETAILED DESCRIPTION OF THE EMBODIMENTS

Hereinafter, referring to appended drawings of FIG. 2a~FIG. 6d, the embodiments of the present invention are described in detail.

First, let us review the structure of a double-gate element constituted on an SOI substrate in the prior CMOS element-related researches for better understanding of the present invention.

The above-described double-gate element is characterized by the shortest possible channel length among the elements that have been developed up to the present.

Figure 2A:
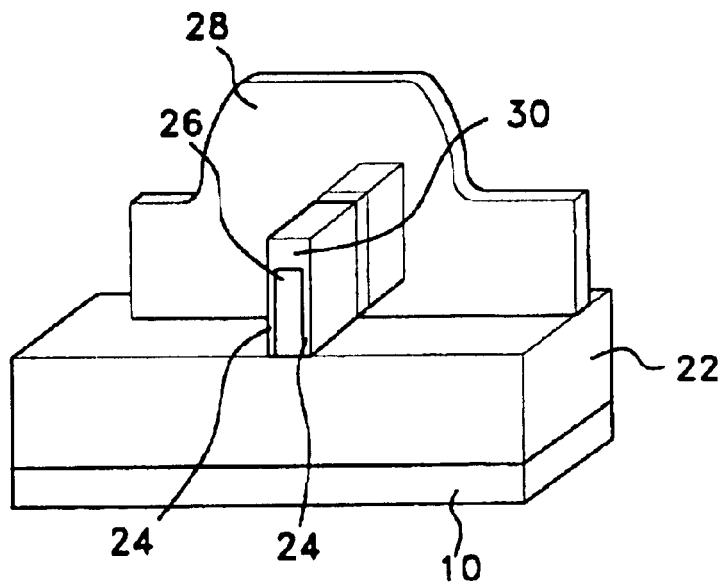
Figure 2B:
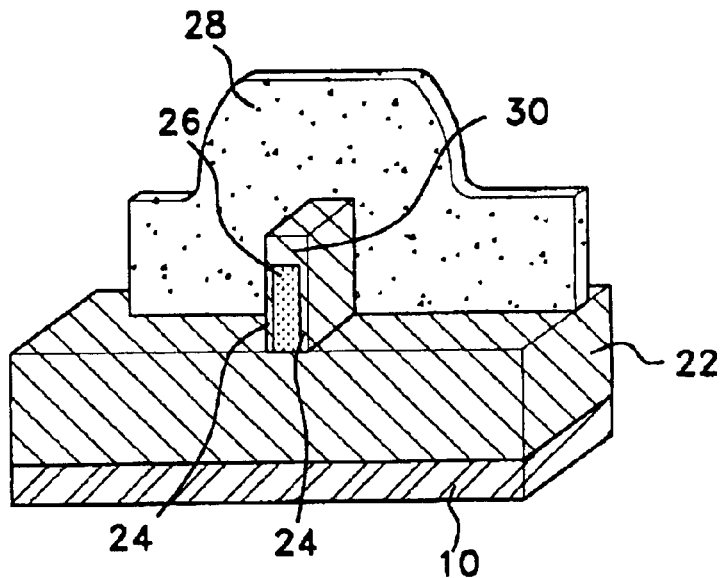

FIG. 2a and FIG. 2b are views illustrating a double-gate element formed on an SOI substrate, wherein the gate is described to be transparent in FIG. 2a and opaque in FIG. 2b.

The double-gate element is constituted to have gate electrode (28) at both sides (or top and bottom) of a channel, and thus it can considerably improve the so-called short-channel effect.

Therefore, by applying this concept to scaling down of flash memory element, the element size can be reduced, the integrity is improved in consequence, and the memory capacity can be increased thereby.

Figure 3A:
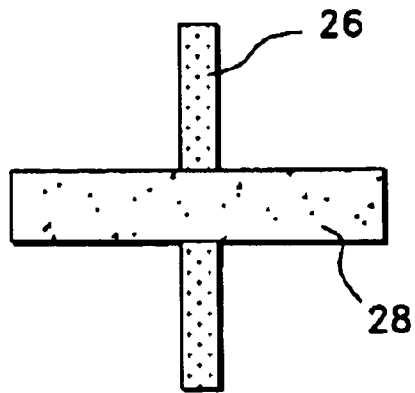
Figure 3B:
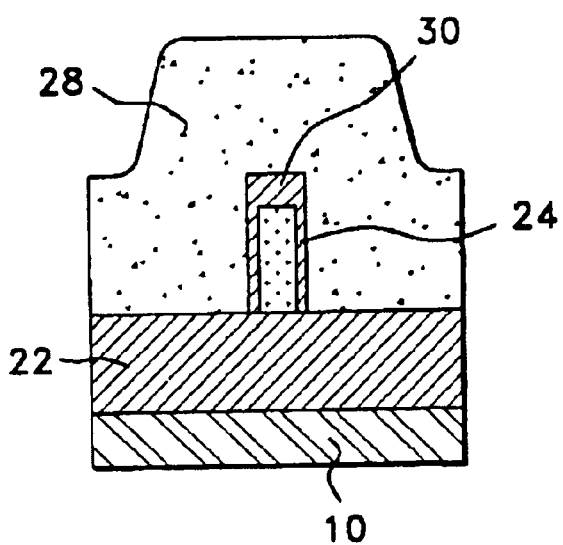
Figure 3C:
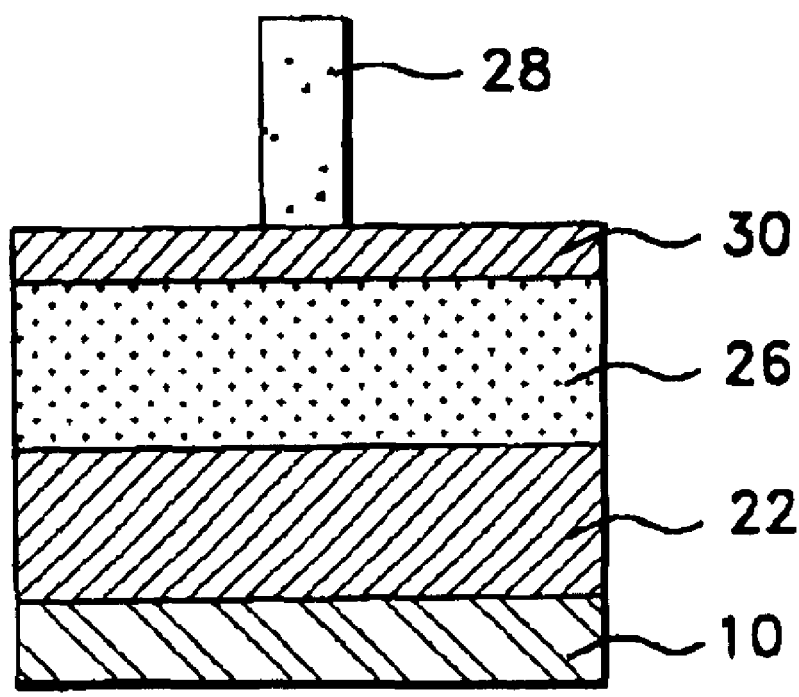

FIG. 3a~FIG. 3c are views illustrating the main portion of a double-gate element described above, wherein FIG. 3a is a top view of an element, and FIG. 3b and FIG. 3c are sectional views of an element in case of crossing the center of a channel in the lateral direction and the longitudinal direction respectively.

The numeral 22 represents a first oxide film (a buried oxide on an SOI wafer), 24 represents a gate oxide film, 26 represents a fin active area comprising a fin-type channel and source/drain, and 30 represents a thick second oxide film formed on the fin active area.

The present invention presents an element configuration that can improve the integrity of a flash memory by further developing the double-gate CMOS element structure described above.

Differently from the conventional structure of a flash memory element formed on a plane channel of a bulk silicon wafer in the prior art, the present invention constitutes a fin active area whose width is less than 150 nm without any limitation on the height of an SOI wafer and uses it as a channel and a source/drain of an element.

FIG. 4a~FIG. 4d are sectional views illustrating the processes of manufacturing a flash memory in accordance with an embodiment of the present invention.

Figure 4A:
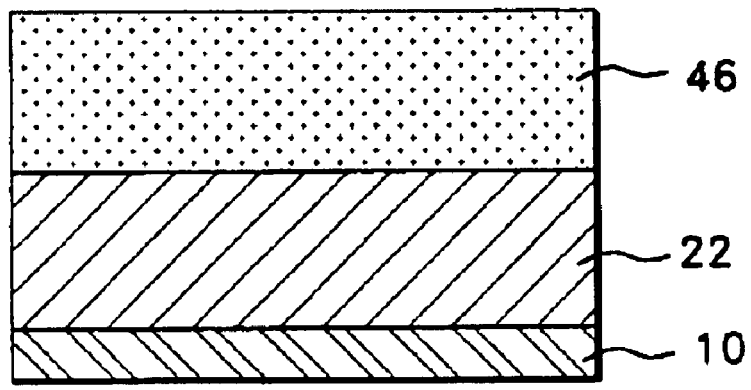
FIG. 4a~FIG. 4d are sectional views illustrating the processes of manufacturing a flash memory in accordance with an embodiment of the present invention.

FIG. 4a shows an SOI substrate composed of a silicon substrate (10), a first oxide film (22) and a silicon film (46).

Figure 4B:
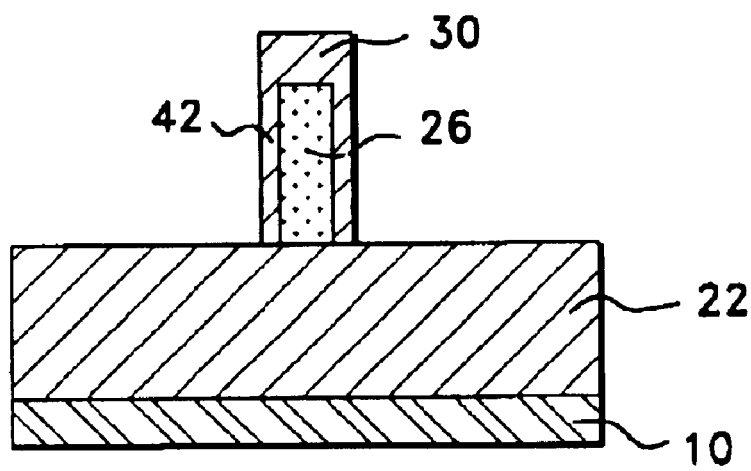

Referring to FIG. 4b, a second oxide film (30) is formed on the silicon film (46) in the first process, a fin active area (26) is formed by forming a pattern thereon followed by an etching in the second process, and a gate tunneling oxide film (42) is formed in the third process.

Here, the height (or thickness) of the fin active area (26) is no more than that of the silicon film (46), and the value of the height is 1 nm~150 nm.

Figure 4C:
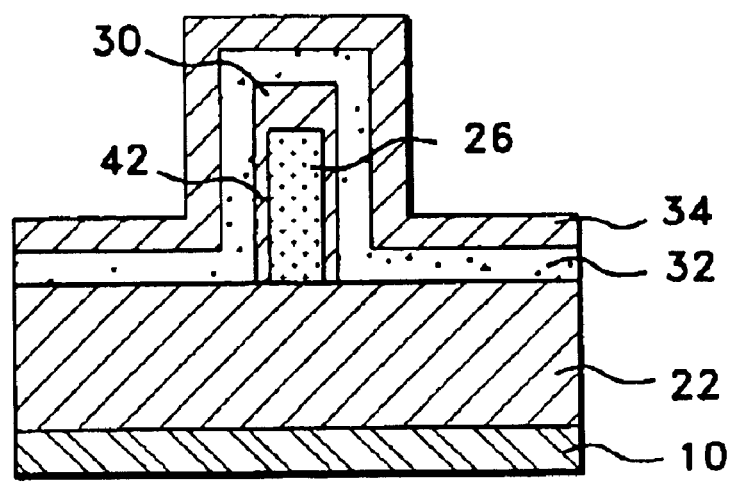

Referring to FIG. 4c, a floating electrode (32) for storing charges is formed in the fourth process and a inter-gates oxide film (34) is formed between the floating electrode (32) and the control electrode (36; not described yet) in the fifth process.

Figure 4D:
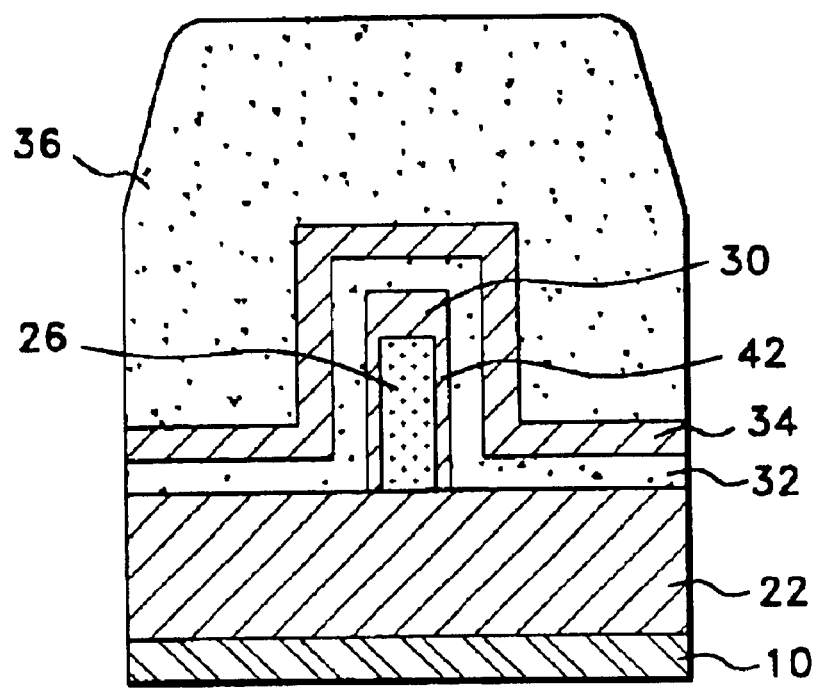

Then, a control electrode (36) is formed thereon in the sixth process as described in FIG. 4d.

A flash memory manufactured by the processes described above comprises: a first oxide film (22) formed on a surface of a silicon substrate (10); a fin active area (26) vertically formed on the first oxide film (22) with a narrow width; a gate tunneling oxide film (42) formed on the top and at both sides of the fin active area (26); a floating electrode (32) formed on the surfaces of the gate tunneling oxide film (42) and the first oxide film (22) for storing electric charges; a inter-gates oxide film (34) formed on the surface of the floating electrode (32); and a control electrode (36) formed on the surface of the inter-gates oxide film (34).

In addition, a second oxide film (30), thicker than the gate tunneling oxide film (42) and thinner than 500 nm, may be formed on the gate tunneling oxide film (42).

Referring to FIG. 4b, by forming a second oxide film (30) on the first oxide film (22) and the silicon film (46) constituted on a surface of a silicon substrate (10), coating a photoresist thereon, and dry-etching with narrow-width nano patterning, a vertical-shape silicon nano pattern, i.e. a fin active area (26), is constituted.

Here, the fin active area (26) is constituted to be 3 nm~50 nm in its width or $10^{14}$ cm$^{-3}$~$10^{19}$ cm$^{-3}$ in its doping density for being electrically fully depleted or partially depleted in the second process.

In order to improve the element endurance, the four corners of the fin active area (26) are formed to be rounded by dry- or wet-oxidation over 900° C.

After eliminating the photoresist, a process for solving the problems due to plasma etching and a process for stabilizing the gate tunneling oxide film are performed.

Then, a gate tunneling oxide film (42) is formed with a thickness of 2 nm~15 nm on the top and at both sides of the fin active area (26) in the third process.

In the fourth process, a floating electrode (32), in which electric charges can be stored, is formed on the surfaces of the gate tunneling oxide film (42) and the first and the second oxide films (22, 30) as described in FIG. 4c.

Here, the thickness of the substance for constituting the floating electrode is 3 nm~300 nm.

n$^+$ polysilicon, p$^+$ polysilicon, SiGe having a changeable work function, or a metallic material can be a substance for constituting a floating electrode (32).

Figure 5A:
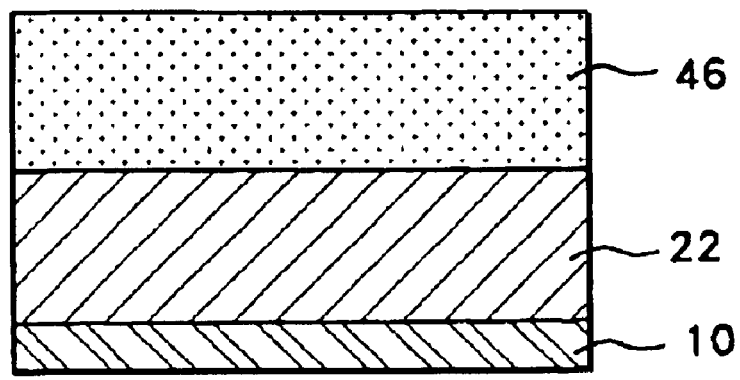
FIG. 5a~FIG. 5d are sectional views illustrating the processes of manufacturing a flash memory in accordance with another embodiment of the present invention.
Figure 5B:
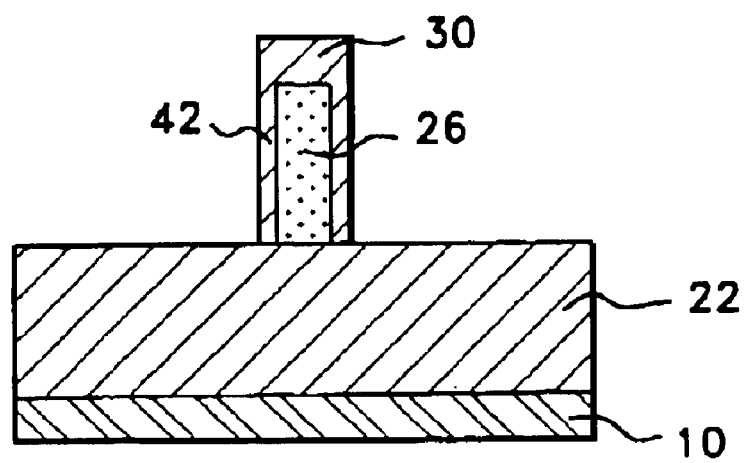
Figure 5C:
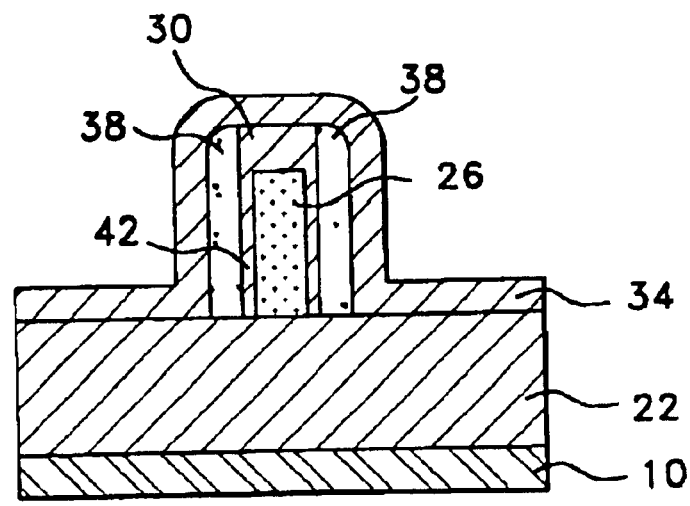

Here, spacer floating electrodes (38) can be formed in spacer-shape at both sides of the gate tunneling oxide film (42) covering the fin active area (26) by anisotropically etching the floating electrode substance in the fourth process as described in FIG. 5c. Or, the floating electrode (32) can remain still without an anisotropic etching on the floating electrode substance as described in FIG. 4c.

The two spacer floating electrodes (38) formed at both sides of the gate tunneling oxide film (42) can store charges independently by being set to be electrically independent.

The first to the fourth process described in FIG. 5a and FIG. 5b are the same as those in FIG. 4a and FIG. 4b, and thus the explanation on these processes is omitted.

Next, a inter-gates oxide film (34) is formed of an insulating material on the floating electrode (32, or 38) with a thickness of 5 nm~40 nm in the fifth process as described in FIG. 4c or FIG. 5c.

Figure 5D:
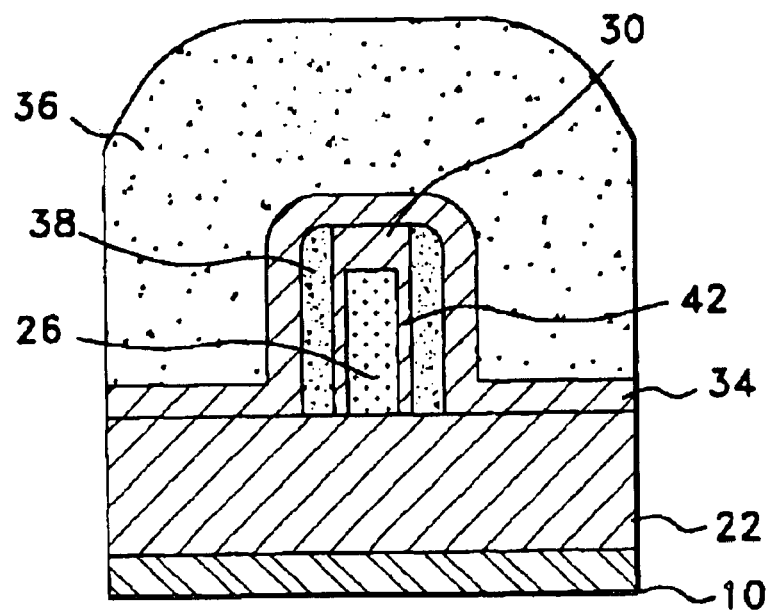
Figure 6A:
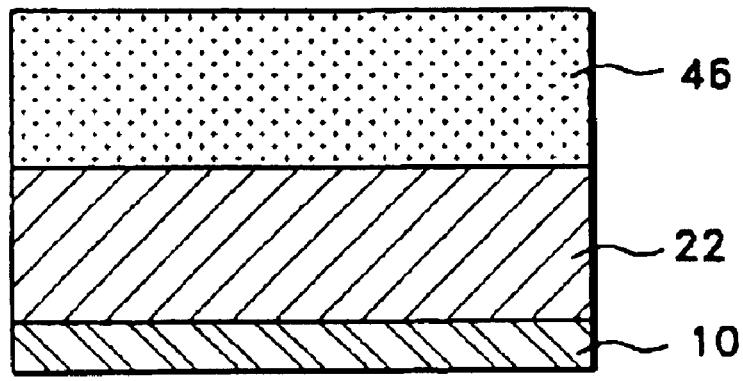
FIG. 6a~FIG. 6d are sectional views illustrating the processes of manufacturing a flash memory in accordance with yet another embodiment of the present invention.
Figure 6B:
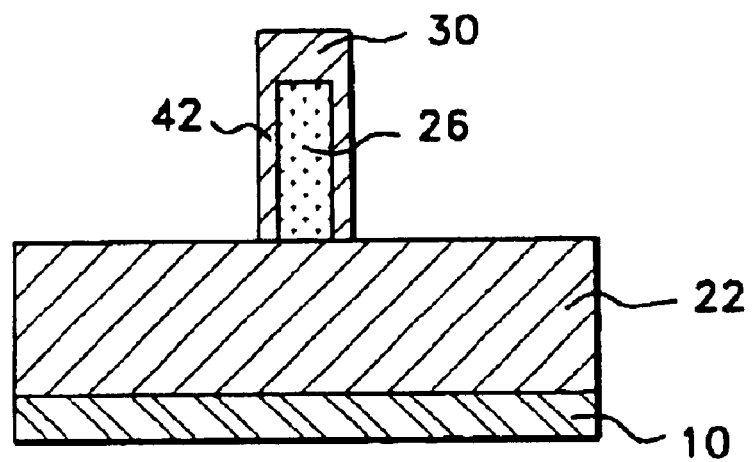
Figure 6C:
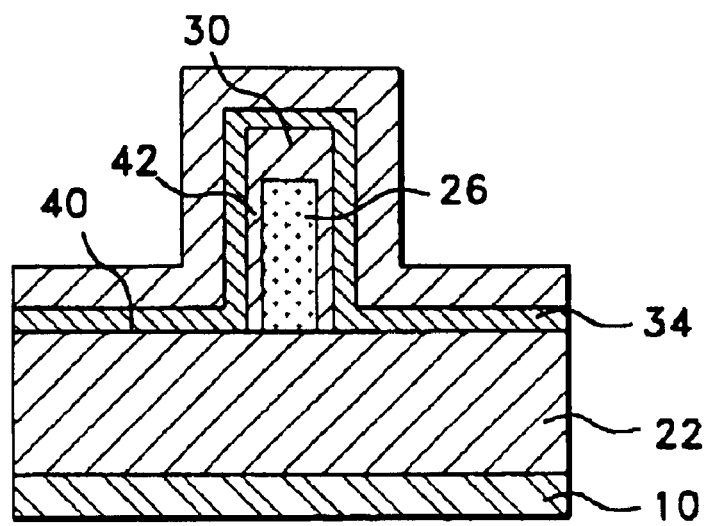
Figure 6D:
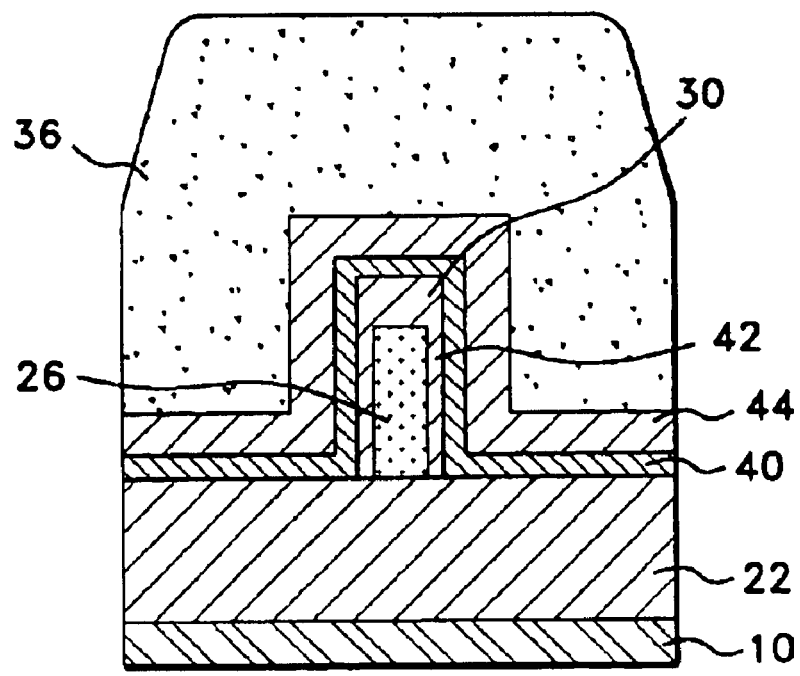
Figure 7A:
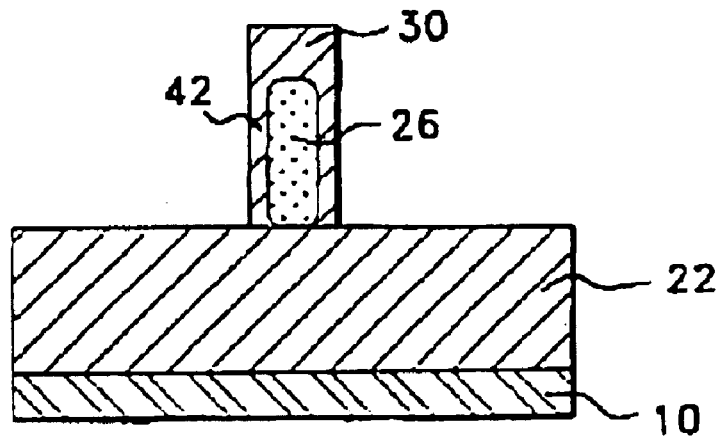
FIG. 7a~FIG. 7b are sectional views illustrating an intermediate step in the processes of manufacturing a flash memory in accordance with yet another embodiment of the present invention.
Figure 7B:
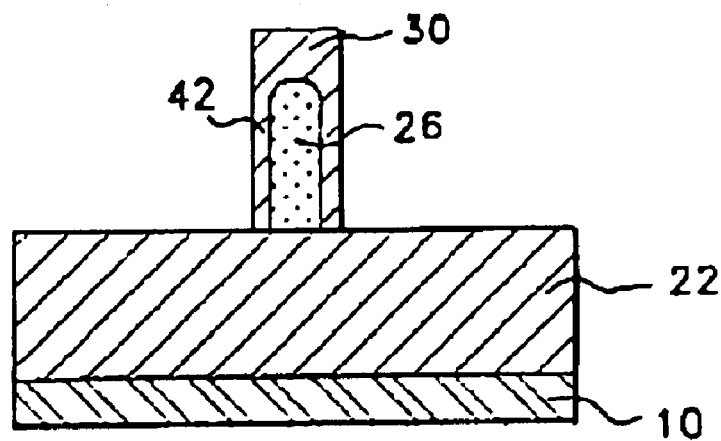

Then, a control electrode (36) is formed on the inter-gates oxide film (34) in the sixth process as described in FIG. 4d or FIG. 5d.

In case of FIG. 4d, the floating electrode (32) remains still without being anisotropically etched and is eventually defined together with the control electrode (36). And thus, the top view is the same as the control electrode (36).

In FIG. 5d, increasing the capacity between the control electrode (36) and the spacer floating electrode (38) by thickening the gate tunneling oxide film (42) and heightening the spacer floating electrode (38), the writing voltage of a flash memory can be lowered.

Conclusively, the flash memory elements described in FIG. 4 and FIG. 5 have an advanced structure of double-gate CMOS element, where a floating electrode (32 or 38), a inter-gates oxide film (34) and a control electrode (36) are formed at both sides of an active area channel, i.e. the fin active area (26), and thus they are very effective for being scaled down.

In addition to an excellent scaling down characteristic described above, the present invention provides other supplementary advantages:

Looking into FIG. 5d where spacer floating electrodes (38) are constituted in the form of spacer at both sides of a fin active area (26), the spacer floating electrodes (38) at both sides are electrically isolated from each other, and thus they can store charges independently.

For example, even when the charges in a spacer floating electrode (38) at the left side are leaked out, the charges in a spacer floating electrode (38) at the right side can be still preserved so that the program characteristic is maintained.

In addition, in the normal state where charges are stored in both spacer floating electrodes (38), it provides a characteristic of considerably increasing the threshold voltage compared with that of the conventional structure where charges are stored in the floating electrode formed at a plane channel.

Therefore, a flash memory element in accordance with the present invention has no problem in its memory function even when relatively small amounts of charges are stored in the spacer floating electrodes (38) at both sides. This means that the amount of tunneling charges through a gate tunneling oxide film (42) can be reduced, and consequently the lifetime of a gate tunneling oxide film (42) can be increased.

In case of a floating electrode (32) without being anisotropically etched in FIG. 4d, it shows almost the same excellent characteristics as those of the spacer floating electrode (38) in FIG. 5d.

In this case, the floating electrode (32) has the same shape as that of the control electrode (36) when watching the memory element from the top, and is overlapped in the area of the control electrode (36). Therefore, the capacity between the two electrodes (32, 36) is so large that the writing voltage for storing information can be lowered considerably.

In addition, it stores charges at both sides of channel, i.e. the fin active area (26), just like in the case of spacer floating electrode (38). to increase the channel threshold voltage, and thus it can control the threshold voltage in a wider range with the same amount of charges. In consequence, it increases the endurance of a gate tunneling oxide film (42).

FIG. 6 shows another example of a flash memory element with the similar characteristics to those of the elements described in FIG. 4 and FIG. 5.

Looking into FIG. 6, the manufacturing method comprises: the first process of forming a second oxide film (30) on a silicon film (46) of an SOI type wafer constituted of a silicon substrate (10), a first oxide film (22) and a silicon film (46); the second process of forming a fin active area (26) by forming a pattern thereon and etching it thereafter; the third process of forming a gate tunneling oxide film (42) on the top and at both sides of the fin active area (26); the fourth process of forming a nitride film (40), which stores electric charges by using traps, on the surfaces of the gate tunneling oxide film (42) and the first and the second oxide films (22, 30); the fifth process of forming a third oxide film (44) on the surface of the nitride film (40); and the sixth process of forming a control electrode (36) on the surface of the third oxide film (44).

Compared with the methods described in FIG. 4 and FIG. 5, the method described in FIG. 6 can thin the thickness of the gate tunneling oxide film (42) formed in the third process. In the method described in FIG. 6, a nitride film (40) is formed, instead of a floating electrode (32 or 38), in the fourth process as described in FIG. 6b.

In other words, instead of using a floating electrode (32 or 38) in FIG. 4 or FIG. 5, a nitride film, an insulating material containing traps, is used for storing charges by program. Besides, a third oxide film (44) is formed between the nitride film (40) and the control electrode (36) instead of a inter-gates oxide film (34).

A flash memory manufactured by the method described in FIG. 6 comprises: a first oxide film (22) formed on a surface of a silicon substrate (10); a fin active area (26) vertically formed on the first oxide film (22) with a narrow width; a gate tunneling oxide film (42) formed on the top and at both sides of the fin active area (26); a nitride film (40), for storing electric charges by using traps, formed on the surfaces of the gate tunneling oxide film (42) and the first oxide film (22); a third oxide film (44) formed on the surface of the nitride film (40); and a control electrode (36) formed on the surface of the third oxide film (44).

This is called a SONOS type flash memory element configuration.

Here, by carrying out an anisotropic etching on the nitride film (40) to shape it to a spacer shape similar to the spacer floating electrode (38) in FIG. 5, the same effect as that of the spacer floating electrode (38) in FIG. 5 can be obtained.

Since the nitride film (40) storing charges in traps is a substantially insulating material, the programmed charges in a memory element described in FIG. 6 are hardly leaked out due to a problem of the gate tunneling oxide film (42) and/or a bias condition compared with those in memory elements described in FIG. 4 and FIG. 5. Therefore, the retention characteristic is relatively better and the manufacturing processes are relatively simple.

Since the thickness of the gate tunneling oxide film (42) and the third oxide film (44) of an SONOS type flash memory element can be thinned compared with that of the gate tunneling oxide film (42) and the inter-gates oxide film (34) of a flash memory element in FIG. 4 or FIG. 5, the writing voltage can be lowered in programming.

That is, the thickness of the gate tunneling oxide film (42) is 0.5 nm~10 nm, the thickness of the nitride film (40) is 0.5 nm~50 nm, and the thickness of the third oxide film (44) is 0.5 nm~50 nm.

For evaluating the effectiveness of an SONOS type flash memory element proposed in the present invention compared with the conventional SONOS type flash memory element in the prior art, let us first investigate what causes the scaling down characteristic problem in the prior art.

Figure 1B:
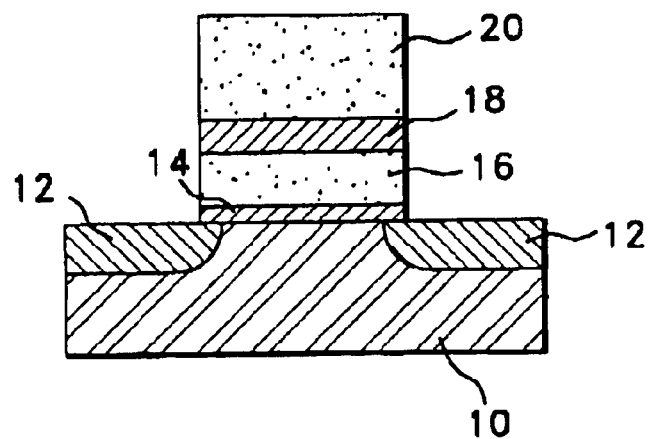

To begin with, assuming that the floating electrode (16) in FIG. 1 is formed of nitride film, it is the structure of an SONOS type flash memory element in the prior art.

In the prior SONOS structure like this, a tunneling oxide film (14) is constituted to be an ONO (oxide-nitride-oxide) structure, and thus the thickness of the tunneling oxide film (14) can not be thinned compared with that of a conventional MOS element. Consequently, there is a limitation in reducing the channel length of an element as mentioned before in the explanation on FIG. 1.

In other words, to perform an easy scaling down of an element, the thickness of a tunneling oxide film (14) should be thinned to suppress the short-channel effect, however, it is impossible under the prior SONOS structure.

Besides, the trap density in the nitride film for storing the tunneling charges in programming stage is formed nonuniform over the whole wafer in the prior SONOS element structure, and thus the threshold voltage of an element may be largely different from one another at each location.

For example, in a nitride film formed on a channel whose length and width are very small, only a very few traps exist in the worst case so that a program may not be carried out.

Thus, the channel length and width of an element should be maintained larger than a certain value to prevent this kind of problem, and in consequence, the size of an element gets bigger and the integrity of a memory element becomes worse.

However, a flash memory element proposed in FIG. 6 of the present invention shows a relatively better scaling down characteristic compared with the conventional bulk structured element by virtue of a double-gate structure.

In addition, by simply heightening the height of the fin active area (26), where channel is formed, the area of channel covered by the nitride film (40) storing charges is enlarged without broadening the two dimensional area from the top. Besides, the area of a channel covered by the nitride film (40) can be considerably enlarged compared with the prior art since the nitride film (40) is formed at both sides of a channel. Thus, the problem due to nonuniform trap density mentioned above can be mitigated very much.

As mentioned thereinbefore, a flash memory element having a double-gate structure in accordance with the present invention improves the scaling down characteristic and the programming and retention characteristic of a flash memory element. That is, the present invention provides a novel flash memory element structure that provides a highly improved integrity as well as supplementary characteristics such as an excellent programming capability, and excellent retention and endurance characteristics.

Since those having ordinary knowledge and skill in the art of the present invention will recognize additional modifications and applications within the scope thereof, the present invention is not limited to the embodiments and drawings described above.

What is claimed is:

1. A flash memory element comprising:
    a first oxide film formed on a surface of a silicon substrate;
    a fin active area vertically formed on said first oxide film with a narrow width;
    a gate tunneling oxide film formed on the top and at both sides of said fin active area;
    a floating electrode formed on the surfaces of said gate tunneling oxide film that is formed on the top and at both side surfaces of said fin active area and said first oxide film for storing electric charges;
    an inter-gates oxide film formed on the surface of said floating electrode; and
    a control electrode formed on the surface of said inter-gates oxide film and consisting of a continuous conducting layer.

2. A flash memory element as claimed in claim 1, characterized in that the width of said fin active area is 1 nm~150 nm.

3. A flash memory element as claimed in claim 1, characterized in that the thickness of the substance for constituting said floating electrode is 3 nm~300 nm.

4. A flash memory element as claimed in claim 1, characterized in that the substance constituting said floating electrode is one among $n^+$ polysilicon, $p^+$ polysilicon, SiGe having a changeable work function, or a metallic material.

5. A flash memory element as claimed in claim 3, characterized in that the substance constituting said floating electrode is one among $n^+$ polysilicon, $p^+$ polysilicon, SiGe having a changeable work function, or a metallic material.

6. A flash memory element as claimed in claim 1, characterized in that the thickness of said gate tunneling oxide film is 2 nm~15 nm.

7. A flash memory element as claimed in claim 1, characterized in that said gate tunneling oxide film is formed on the top and at both sides of said fin active area with same thickness.

8. A flash memory element as claimed in claim 6, characterized in that said gate tunneling oxide film is formed on the top and at both sides of said fin active area with same thickness.

9. A flash memory element as claimed in claim 1, characterized by further comprising a second oxide film formed on said fin active area with a thickness thicker than that of said gate tunneling oxide film but less than 500 nm.

10. A flash memory element as claimed in claim 1, characterized in that the thickness of said inter-gates oxide film is 5 nm~40 nm.

11. A flash memory element as claimed in claim 1, comprising:
a first oxide film formed on a surface of a silicon substrate;
a fin active area vertically formed on said first oxide film with a narrow width;
a gate tunneling oxide film formed on the top and at both sides of said fin active area;
a floating electrode formed on the surfaces of said gate tunneling oxide film that is formed on the top and at both side surfaces of said fin active area and said first oxide film for storing electric charges;
an inter-gates oxide film formed on the surface of said floating electrode; and
a control electrode formed on the surface of said inter-gates oxide film and consisting of a continuous conducting layer;
characterized in that the corners of said fin active area are constituted to be round-shaped.

12. A flash memory element comprising:
a first oxide film formed on a surface of a silicon substrate;
a fin active area vertically formed on said first oxide film with a narrow width;
a gate tunneling oxide film formed on the top and at both sides of said fin active area;
a floating electrode formed on the surfaces of said gate tunneling oxide film that is formed on the top and at both side surfaces of said fin active area and said first oxide film for storing electric charges;
an inter-gates oxide film formed on the surface of said floating electrode; and
a control electrode formed on the surface of said inter-gates oxide film and consisting of a continuous conducting layer;
characterized in that said floating electrode not having horizontal portions to cover said oxide film is formed to be spacer-shaped at both sides of said fin active area by anisotropic etching.

13. A flash memory element comprising:
a first oxide film formed on a surface of a silicon substrate;
a fin active area vertically formed on said first oxide film with a narrow width;
a gate tunneling oxide film formed on the top and at both sides surfaces of said fin active area;
a nitride film, for storing electric charges by using traps, formed on the surfaces of said gate tunneling oxide film and said first oxide film;
a third oxide film formed on the surface of said nitride film; and
a control electrode formed on the surface of said third oxide film and consisting of a continuous conducting layer.

14. A flash memory element as claimed in claim 13, characterized in that the thickness of said gate tunneling oxide film is 0.5 nm~10 nm, the thickness of said nitride film is 0.5 nm~50 nm, and the thickness of said third oxide film between said nitride film and said control electrode is 0.5 nm~50 nm.

15. A manufacturing method of a flash memory element comprising:
a first process of forming a second oxide film on a silicon film of an SOI type wafer constituted of a silicon substrate, a first oxide film and a silicon film;
a second process of forming a fin active area by forming a pattern thereon and etching it thereafter;
a third process of forming a gate tunneling oxide film on the top and at both sides of said fin active area;
a fourth process of forming a floating electrode on the surfaces of said gate tunneling oxide film that is formed on the top and at both side surfaces of said fin active are and said first and second oxide films for storing electric charges;
a fifth process of forming an inter-gates oxide film on the surface of said floating electrode; and
a sixth process of forming a control electrode on the surface of said inter-gates oxide film and consisting of a continuous conducting layer.

16. A manufacturing method of a flash memory element as claimed in claim 15,
characterized in that said fin active area is fully depleted or partially depleted in said second process.

17. A manufacturing method of a flash memory element comprising:
a first process of forming a second oxide film on a silicon film of an SOI type wafer constituted of a silicon substrate, a first oxide film and a silicon film;
a second process of forming a fin active area by forming a pattern thereon and etching it thereafter;
a third process of forming a gate tunneling oxide film on the top and at both sides of said fin active area;
a fourth process of forming a floating electrode on the surfaces of said gate tunneling oxide film that is formed on the top and at both side surfaces of said fin active are and said first and second oxide films for storing electric charges;
a fifth process of forming an inter-gates oxide film on the surface of said floating electrode; and
a sixth process of forming a control electrode on the surface of said inter-gates oxide film and consisting of a continuous conducting layer;
characterized in that the four corners of said fin active area are shaped to be rounded by performing a dry- or wet-oxidation over 900° C. on said fin active area.

18. A manufacturing method of a flash memory element comprising:
a first process of forming a second oxide film on a silicon film of an SOI type wafer constituted of a silicon substrate, a first oxide film and a silicon film;
a second process of forming a fin active area by forming a pattern thereon and etching it thereafter;
a third process of forming a gate tunneling oxide film on the top and at both sides of said fin active area;
a fourth process of forming a floating electrode on the surfaces of said gate tunneling oxide film that is formed on the top and at both side surfaces of said fin active are and said first and second oxide films for storing electric charges;

a fifth process of forming an inter-gates oxide film on the surface of said floating electrode; and a sixth process of forming a control electrode on the surface of said inter-gates oxide film and consisting of a continuous conducting layer;

characterized in that said fin active area is fully depleted or partially depleted in said second process and that the four corners of said fin active area are shaped to be rounded by performing a dry- or wet-oxidation over 900° C. on said fin active area.

19. A manufacturing method of a flash memory element comprising:

a first process of forming a second oxide film on a silicon film of an SOI type wafer constituted of a silicon substrate, a first oxide film and a silicon film;

a second process of forming a fin active area by forming a pattern thereon and etching it thereafter;

a third process of forming a gate tunneling oxide film on the top and at both sides of said fin active area;

a fourth process of forming a floating electrode on the surfaces of said gate tunneling oxide film that is formed on the top and at both side surfaces of said fin active are and said first and second oxide films for storing electric charges;

a fifth process of forming an inter-gates oxide film on the surface of said floating electrode; and a sixth process of forming a control electrode on the surface of said inter-gates oxide film and consisting of a continuous conducting layer;

characterized in that said floating electrode not having horizontal portions to cover said oxide film is formed to be spacer floating electrodes, spacer-shaped at both sides of said fin active area by anisotropic etching in said fourth process.

20. A manufacturing method of a flash memory element comprising:

a first process of forming a second oxide film on a silicon film of an SOI type wafer constituted of a silicon substrate, a first oxide film and a silicon film;

a second process of forming a fin active area by forming a pattern thereon and etching it thereafter;

a third process of forming a gate tunneling oxide film on the top and at both sides of said fin active area;

a fourth process of forming a floating electrode on the surfaces of said gate tunneling oxide film that is formed on the top and at both side surfaces of said fin active are and said first and second oxide films for storing electric charges;

a fifth process of forming an inter-gates oxide film on the surface of said floating electrode; and a sixth process of forming a control electrode on the surface of said inter-gates oxide film and consisting of a continuous conducting layer;

characterized in that said floating electrode not having horizontal portions to cover said oxide film is formed to be spacer floating electrodes, spacer-shaped at both sides of said fin active area by anisotropic etching in said fourth process and characterized in that said spacer floating electrodes not having horizontal portions to cover said oxide film at both sides of said gate tunneling oxide film are set to be electrically independent from each other.

21. A manufacturing method of a flash memory element comprising:

a first process of forming a second oxide film on a silicon film of an SOI type wafer constituted of a silicon substrate, a first oxide film and a silicon film;

a second process of forming a fin active area by forming a pattern thereon and etching it thereafter;

a third process of forming a gate tunneling oxide film on the top and at both sides of said fin active area;

a fourth process of forming a floating electrode on the surfaces of said gate tunneling oxide film that is formed on the too and at both side surfaces of said fin active are and said first and second oxide films for storing electric charges;

a fifth process of forming an inter-gates oxide film on the surface of said floating electrode; and a sixth process of forming a control electrode on the surface of said inter-gates oxide film and consisting of a continuous conducting layer;

characterized in that said floating electrode not having horizontal portions to cover said oxide film is formed to be spacer floating electrodes, spacer-shaped at both sides of said fin active area by anisotropic etching in said fourth process and characterized by increasing the capacity between said control electrode and said spacer floating electrode not having horizontal portions to cover said oxide film by heightening said spacer floating electrode and thickening said gate tunneling oxide film.

22. A manufacturing method of a flash memory element comprising:

a first process of forming a second oxide film on a silicon film of an SOI type wafer constituted of a silicon substrate, a first oxide film and a silicon film;

a second process of forming a fin active area by forming a pattern thereon and etching it thereafter;

a third process of forming a gate tunneling oxide film on the top and at both sides surfaces of said fin active area and said first oxide film for storing electric charges;

a fourth process of forming a nitride film, which stores electric charges by using traps, on the surfaces of said gate tunneling oxide film and said first and second oxide films;

a fifth process of forming a third oxide film on the surface of said nitride film; and a sixth process of forming a control electrode on the surface of said third oxide film and consisting of a continuous conducting layer.

23. A manufacturing method of a flash memory element comprising:

a first process of forming a second oxide film on a silicon film of an SOI type wafer constituted of a silicon substrate, a first oxide film and a silicon film;

a second process of forming a fin active area by forming a pattern thereon and etching it thereafter;

a third process of forming a gate tunneling oxide film on the ton and at both sides surfaces of said fin active area and said first oxide film for storing electric charges;

a fourth process of forming a nitride film, which stores electric charges by using traps, on the surfaces of said pate tunneling oxide film and said first and second oxide films;

a fifth process of forming a third oxide film on the surface of said nitride film; and a sixth process of forming a control electrode on the surface of said third oxide film and consisting of a continuous conducting layer;

characterized in that said nitride film storing charges is formed to be spacer-shaped by anisotropic etching.

* * * * *